United States Patent
Fox et al.

(10) Patent No.: US 7,037,757 B2
(45) Date of Patent: May 2, 2006

(54) STACKED SEMICONDUCTOR MODULE

(75) Inventors: Thomas F. Fox, Palo Alto, CA (US);
Sayeh Khalili, San Jose, CA (US);
Belgacem Haba, Cupertino, CA (US);
David Nguyen, San Jose, CA (US);
Richard Warmke, San Jose, CA (US);
Xingchao Yuan, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 163 days.

(21) Appl. No.: 10/783,822

(22) Filed: Feb. 20, 2004

(65) Prior Publication Data

US 2004/0164393 A1  Aug. 26, 2004

Related U.S. Application Data

(62) Division of application No. 09/792,788, filed on Feb. 22, 2001, now Pat. No. 6,720,643.

(51) Int. Cl.
*H01L 21/44* (2006.01)
*H01L 21/48* (2006.01)
*H01L 21/50* (2006.01)

(52) U.S. Cl. ...................... 438/109; 438/108
(58) Field of Classification Search ............... 438/109, 438/108, 110, 106, 14
See application file for complete search history.

(56) References Cited

U.S. PATENT DOCUMENTS

| | | | |
|---|---|---|---|
| 5,783,870 A | 7/1998 | Mostafazadeh et al. | 257/686 |
| 6,057,598 A | 5/2000 | Payne et al. | 257/723 |
| 6,215,182 B1 | 4/2001 | Ozawa et al. | |
| 6,340,845 B1 | 1/2002 | Oda | 257/777 |
| 6,376,904 B1 | 4/2002 | Haba et al. | 257/686 |
| 6,452,259 B1 | 9/2002 | Akiyama | 257/777 |
| 2001/0000489 A1* | 4/2001 | Farnworth | 438/4 |

* cited by examiner

*Primary Examiner*—Phat X. Cao
(74) *Attorney, Agent, or Firm*—Morgan, Lewis & Bockius LLP

(57) ABSTRACT

The semiconductor module is provided that includes a semiconductor housing and a plurality of integrated circuit dice positioned within the housing. The semiconductor module also includes a programmable memory device positioned within the housing and electrically coupled to the plurality of integrated circuit dice. The programmable memory device is programmable to identify the integrated circuit dice that meet a predetermined standard, such as an operating frequency requirement, or a core timing grade. Further, a method is provided for accessing a semiconductor module. The above mentioned housing is provided to enclose the plurality of integrated circuit dice and the programmable memory device. The integrated circuit dice of the plurality of integrated circuit dice that meet a predetermined standard are then identified. The programmable memory device is subsequently programmed to identify the selected integrated circuit dice.

33 Claims, 4 Drawing Sheets

STACKED SEMICONDUCTOR MODULE

CROSS REFERENCE TO RELATED APPLICATIONS

This application is a divisional of, and claims priority to, prior U.S. application Ser. No. 09/792,788, filed Feb. 22, 2001, now U.S. Pat. No. 6,720,643 which application is incorporated herein by reference in its entirety.

TECHNICAL FIELD

The present invention relates to semiconductor modules and in particular to multi-chip or stacked integrated circuit (IC) die modules having separately addressable IC dice.

BACKGROUND OF THE INVENTION

The semiconductor industry is constantly producing smaller and more complex semiconductors, sometimes called integrated circuits (ICs) or chips. This trend has brought about the need for smaller semiconductor packages with smaller footprints, higher lead counts, and better electrical and thermal performance, while at the same time meeting accepted reliability standards.

As memory demands increase, so does the need for increased memory capacity. A problem with adding more ICs to a circuit board for increased memory capacity, is that placement of the ICs on the circuit board is spread out, which often requires reconfiguration of the circuit board connectors and their associated connections on a motherboard. This ultimately leads to replacing the circuit board and in some cases the entire motherboard.

One solution to adding more memory capacity without spreading out ICs on a circuit board is by using a 3-dimensional chip stacking technique to form multi-chip modules (MCMs), otherwise known as stacked semiconductor modules, or stacked IC modules. These MCMs have a high memory capacity, while retaining a relatively small size. Examples of these techniques are disclosed in U.S. Pat. Nos. 5,104,820, and 5,279,991, and U.S. patent application Ser. Nos. 09/471,304 and 09/685,941, all of which are incorporated herein by reference.

These prior art stacked semiconductor modules require all IC dice within the MCM to be in adequate working order after assembly. If any of the IC dice are found to be defective during or after the assembly process, the entire MCM is scrapped, as there is no means of utilizing only the working IC dice.

The manufacturing process of these MCMs is typically as follows. Each manufactured IC die is tested for desired characteristics, such as speed BIN, operating frequency, etc. The IC dice are then sorted based on their measured characteristics. For example, all 600 MHz dice are collected together, all 700 MHz dice are collected together, and all 800 MHz dice are collected together. The IC dice from a single sorted group are then assembled into stacks and packaged together to form a stacked semiconductor module or MCM. For example, multiple 800 MHz IC dice are packaged together to form an In-line memory module, such as a RAMBUS PC800 RDRAM™ RIMM™ (a RDRAM™ is a RAMBUS Dynamic Random Access Memory, and a RIMM™ is a RAMBUS In-line Memory Module).

The problem with the above process for forming MCMs, is that if during or after assembly it is found that one of the IC dice is not operating or does not have the required characteristics, for instance because an IC die was damaged during assembly, that MCM is scrapped. The cost of scrapping modules can be significant. Furthermore, if only one IC die is found to be unacceptable, the whole MCM is scrapped, including the IC dice within the MCM that were found to be acceptable. This leads to a wastage of potentially valuable IC dice. Moreover, the cost of scrapping MCMs prohibits the manufacture of MCMs having many stacks of IC dice, because if one IC die in a single stack is found to be unacceptable, the whole MCM is scrapped, wasting even more IC dice.

In view of the foregoing it would be highly desirable to provide an MCM that overcomes the shortcomings of prior art devices by addressing the problem of having to scrap entire MCMs when one or more of the embedded IC dice are found to be unacceptable.

SUMMARY OF THE INVENTION

According to the invention there is provided a semiconductor module. The semiconductor module includes a semiconductor housing and a plurality of integrated circuit dice positioned within the housing. The semiconductor module also includes a programmable memory device positioned within the housing and electrically coupled to the plurality of integrated circuit dice. The programmable memory device is programmable to identify integrated circuit dice that meet a predetermined standard, such as an operating frequency requirement, or a core timing grade. These semiconductor modules supply a high memory capacity by stacking IC dice over a short distance of channel. Channel as used herein is any bus that communicates data signals, address signals, control signals, or the like.

Further according to the invention there is provided a method of accessing a semiconductor module. The above housing is provided to enclose the plurality of integrated circuit dice and the programmable memory device. Selected integrated circuit dice of the plurality of integrated circuit dice that meet a predetermined standard, are then identified. The programmable memory device is subsequently programmed to identify the selected integrated circuit dice.

The programmable memory device thereby allows manufacturers to test all IC dice in a semiconductor module after assembly and store the number of working IC dice and their location in the programable memory device, such that a controller can use the semiconductor modules.

The IC dice within the semiconductor module also preferably share a number of contacts or ball-outs, thereby, reducing the footprint of the semiconductor module. Such common contacts may include common ground lines, power lines, reference lines, or the like.

Another embodiment includes a semiconductor module that straddles multiple channels, allowing for more efficient use of IC dice and having the added advantage of sharing a single heat spreader for more efficient heat dissipation.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE PREFERRED EMBODIMENTS

The present invention is directed toward a multi-chip module (MCM) or semiconductor module having a plurality of IC dice and a programmable memory device within a single semiconductor housing. This semiconductor module addresses the problems associated with existing MCMs, such as the scrapping of entire MCMs when a single IC die is found to be unacceptable.

Figure 1:
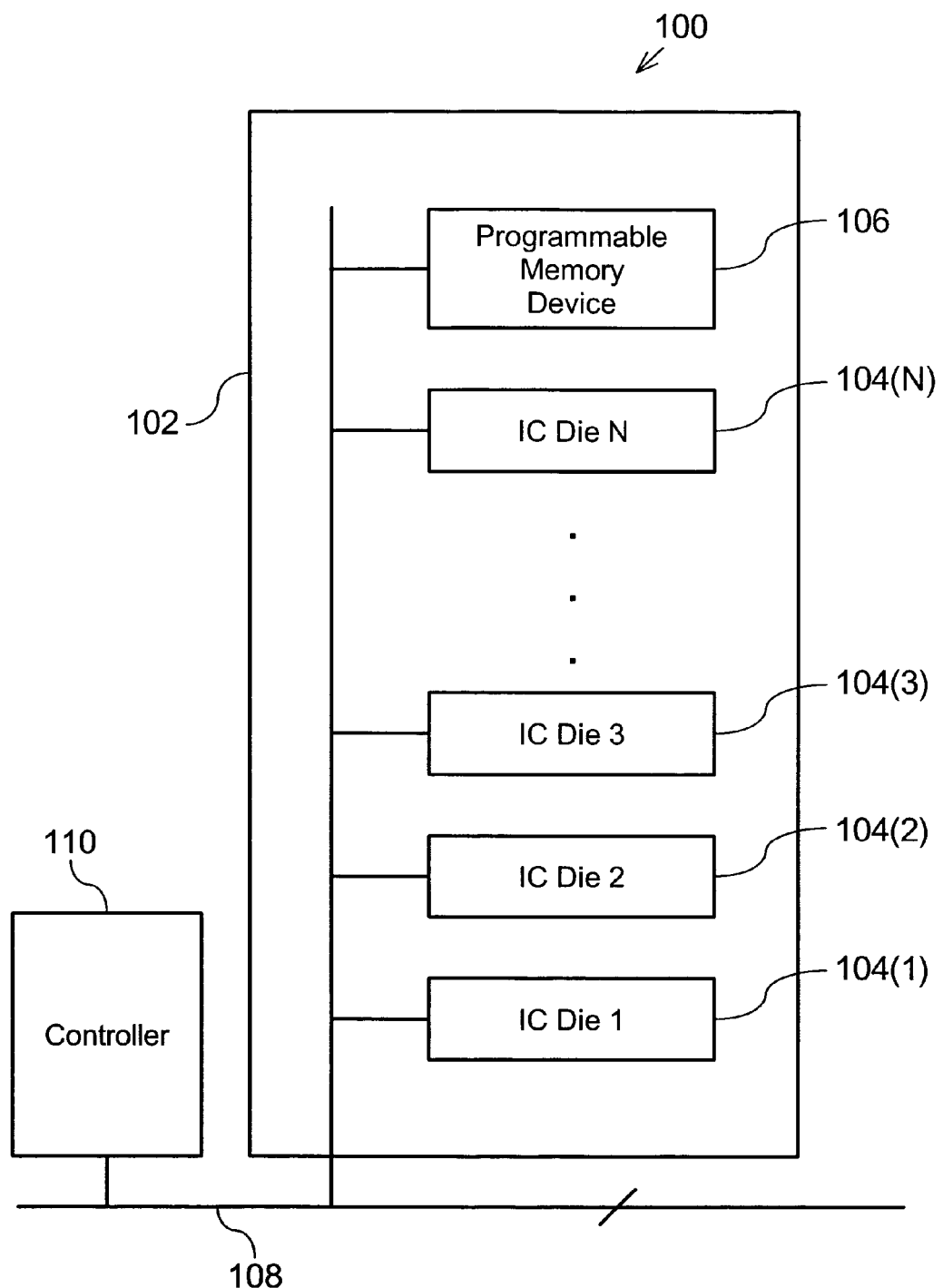
FIG. 1 is a schematic diagram of a semiconductor module according to an embodiment of the invention.

FIG. 1 shows a semiconductor module 100 according to an embodiment of the invention. The semiconductor module 100 includes a housing 102, and a plurality of IC dice 104(1) to 104(N), preferably arranged in a three-dimensional structure within of the housing 102. Arrays of the IC dice 104, sometimes called chips or microchips, are fabricated on semiconductor wafers. Each die may contain thousands or millions of tiny resistors, capacitors, and transistors. The IC dice 104 are preferably computer memories, but alternatively may be circuits that include or function as amplifiers, oscillators, timers, counters, microprocessors, or the like. A channel 108, which is a separate path through which data flows, is electrically coupled to each IC die 104.

Also electrically coupled to the channel 108 and each IC die 104 is a programmable memory device 106. The programmable memory device 106 is preferably an electronic storage medium for instructions and data that a computer's controller 110, also connected to the channel 108, can read from and write to. The controller 110 is a unit that controls the flow of data along the channel 108 between a computer's Central Processing Unit (not shown) and the memory embodied in the IC dice 104. The controller can be a distinct device or it can be built into, or form part of, a computing device's microprocessor.

The programmable memory device 106 is preferably a serial programmable device (SPD), but alternatively may be an electric fuse, an anti-fuse, a random access memory (RAM), a read only memory (ROM), a programmable ROM (PROM), an erasable programmable ROM (EPROM), a read/write integrated circuit chip, or the like. Furthermore, the programmable memory device 106 preferably includes anywhere from a few storage locations to thousands of storage locations.

Although not shown, the stacked semiconductor module 100 may also include one or more thermally conducting or insulating layers between IC dice 104, a heat sink to dissipate any heat built up in the housing 102, or the like.

Figure 2:
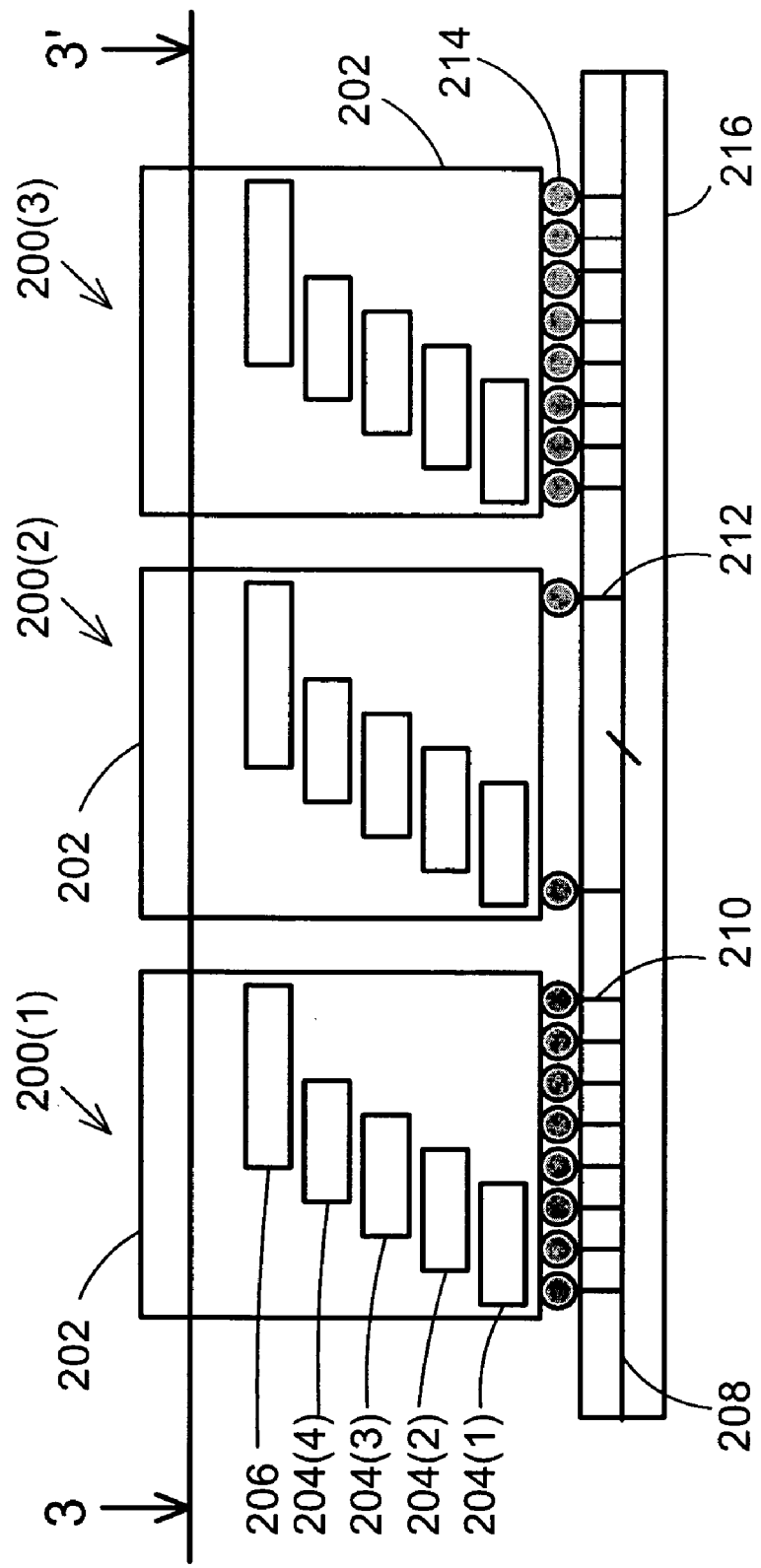
FIG. 2 is a diagrammatic cross-sectional side view of multiple semiconductor modules connected to a channel according to another embodiment of the invention, where the cross-section is taken along line 22' of FIG. 3.
Figure 3:
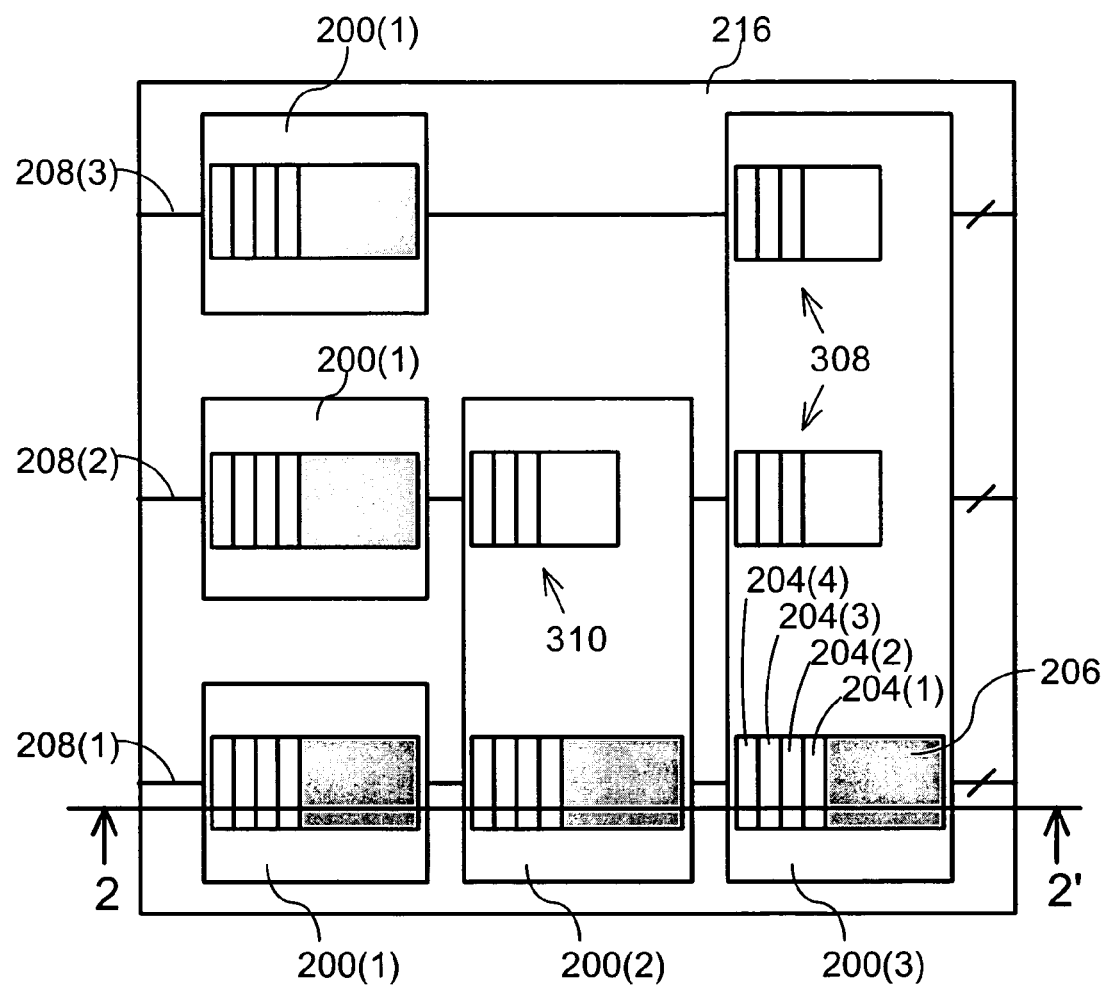
FIG. 3 is a diagrammatic cross-sectional top view of the multiple semiconductor modules of FIG. 2, where the cross-section is taken along the line 33' of FIG. 2.

FIG. 2 is a diagrammatic cross-sectional side view of multiple semiconductor modules 200(1) to 200(3) connected to a channel 208 according to another embodiment of the invention, where the cross-section is taken along line 22' of FIG. 3. Each stacked semiconductor preferably includes four IC dice 204(1) to 204(4) within each housing 202. The IC dice 204 and housing 202 are similar to those shown and described in relation to FIG. 1. Although four IC dice are shown and described, it should be appreciated that any number of IC dice 204 may be disposed in the housing 202.

The IC dice 204 are arranged in a staircase like manner to allow for interconnection between one another. Such a staircase like design is disclosed in U.S. patent application Ser. Nos. 09/471,304 and 09/685,941, both of which are incorporated herein by reference. Each stacked semiconductor module also includes a programmable memory device 206 similar to that shown and described in relation to FIG. 1.

The channel 208 runs along a circuit board 216 and electrically couples to contact points 214 via electrical connectors 210 or 212. The contact points 214 are preferably solder bumps or balls (ball-outs), metal points, bond pads, or any other suitable electrical connection. The IC dice 204 preferably share contact points 214 common to multiple IC dice, such as a common voltage supply contact point, a reference voltage contact point, an electrical ground contact point, or the like. The shared contact points may also include contact points for data lines, address lines, clock lines and other active signal lines. Shared contact points reduce the overall number of contact points 214 for each stacked semiconductor module 200. This reduces the footprint of each stacked semiconductor module 200, thereby, minimizing the area needed for each stacked semiconductor module 200 on the circuit board 216.

The channel 208 preferably connects directly to each IC die 204 in a parallel manner via electrical connectors 210, but alternatively the channel 208 may connect to each IC die 204 in a serial manner via electrical connectors 212.

FIG. 3 is a diagrammatic cross-sectional top view of the multiple semiconductor modules of FIG. 2, where the cross-section is taken along the line 33' of FIG. 2. Various semiconductor modules 200(1), 200(2), and 200(3) are electrically coupled to channels 208(1) to 208(3) on a circuit board 216. Each semiconductor module 200(1), 200(2), or 200(3) includes a number of IC dice 204(1) to (4) and a programmable memory device 206. Semiconductor modules 200(2) and 200(3) also include further stacked IC dice 310 and 308, respectively. Stacked IC dice 310 are also electrically coupled to the programmable memory device 206 on semiconductor module 200(2), while stacked IC dice 308 are electrically coupled to the programmable memory device 206 on semiconductor module 200(3). In this way, a single stacked semiconductor module 200(2) or 200(3) can connect to more than one channel 208. Stacked semiconductor module 200(2) connects to both channels 208(1) and 208(2), while stacked semiconductor module 200(3) connects to all three channels 208(1) to 208(3). By connecting the stacked semiconductor modules 200(2) and 200(3) across multiple channels, even more common electrical contacts 214 (FIG. 2) may be shared. An added advantage is that a single heat spreader (not shown) can be used for multiple stacks, thereby, more efficiently dissipating any heat buildup from the stacked semiconductor modules 200(2) and 200(3). It should be appreciated that any number of IC dice may be located within each housing. It should further be appreciated that the stacks of IC dice do not have to lie directly above a channel but may be located anywhere within the housing. Similarly, the programmable module device may also be located anywhere within the housing. Also, the IC dice do not have to be stacked in a staircase like manner, but may be located within the housing in any suitable manner.

Figure 4:
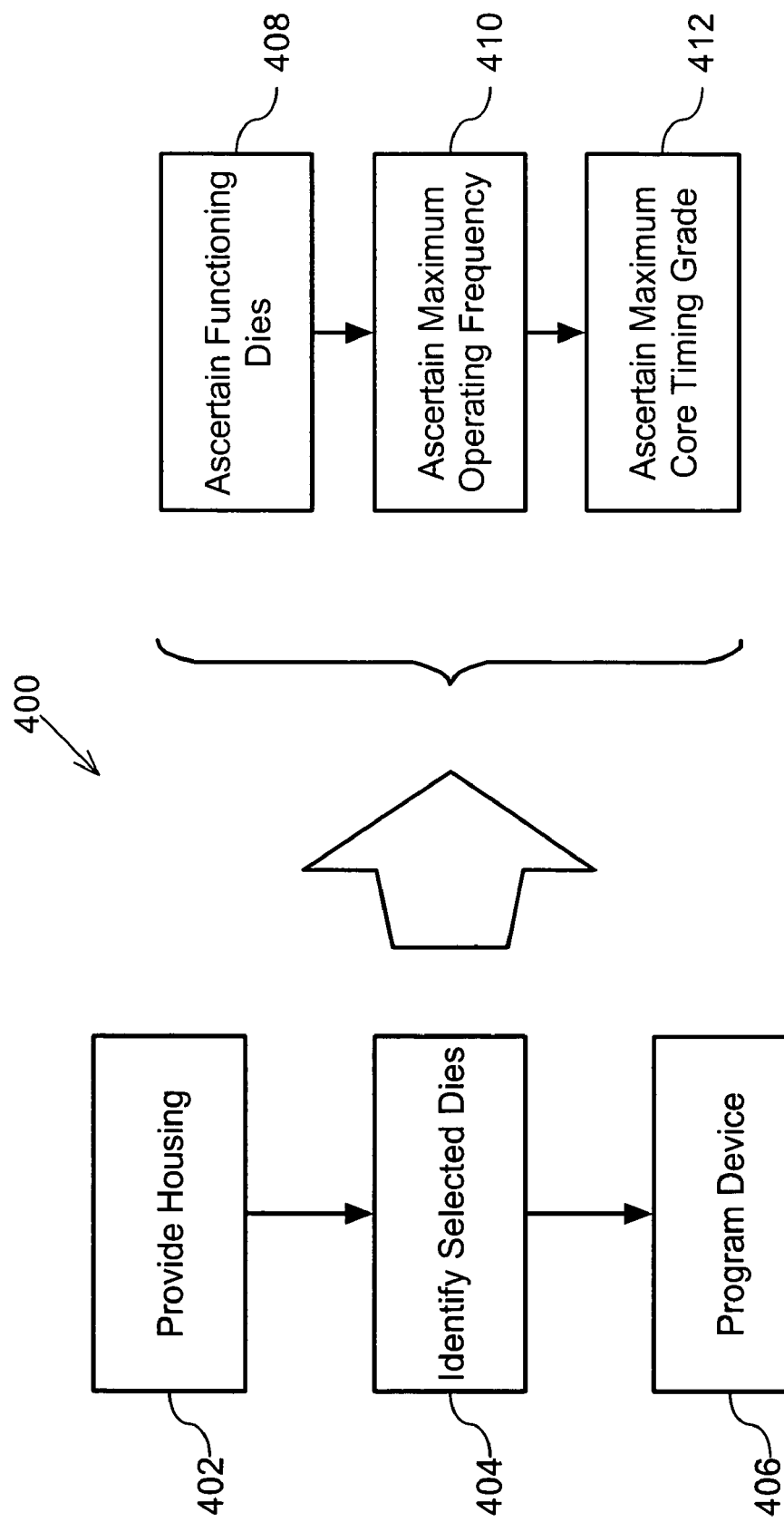
FIG. 4 is a flow chart of a method for accessing a semiconductor module according to an additional embodiment of the invention.

FIG. 4 is a flow chart of a method for accessing a stacked semiconductor module according to an additional embodiment of the invention. A housing 102 (FIG. 1) or 202 (FIG. 2) is provided (step 402) to enclose the plurality of IC dice 102 (FIG. 1) or 204 (FIG. 2) and the programmable memory device 106 (FIG. 1) or 206 (FIG. 2). The stacked semiconductor 100 (FIG. 1) or 200 (FIG. 2) is then assembled where the IC dice are preferably stacked one above the other in a staircase like manner, as shown in FIGS. 2 and 3. Either the programmable memory device itself, or external diagnostic devices are subsequently used to identify (step 404) selected IC dice of the plurality of IC dice that meet a predetermined standard.

Identification (step 404) of the IC dice preferably comprises firstly ascertaining (step 408) which integrated circuit dice are functioning. This may be done by testing each of the IC dice within the stacked semiconductor module. The determination of which IC dice are functional may include a large number of tests of the functionality of each IC die. These tests may include tests performed on each IC die prior to assembly of the semiconductor module, and may include tests that ensure each IC die operates properly at a specified minimum or threshold operating frequency, that a memory array in each IC die operates properly at a specified minimum or threshold core timing grade, as well as at specified minimum and maximum supply voltages. In the preferred embodiment, during the testing of the IC dice in the semiconductor module, a maximum operational frequency is ascertained (step 410) for each functional IC die in the semiconductor module by testing the operation of each IC die at a range of operating frequencies. The lowest of the maximum operating frequencies of the functional IC dice is selected as the maximum operating frequency of the semiconductor module. Thus, the maximum operating frequency of the semiconductor module is a frequency at which it is known that all the functional IC die in the module can properly operate.

In addition, or alternatively, a maximum core timing grade is ascertained (step 412) for each functional IC die in the semiconductor module. The lowest of the maximum core timing grades of the functional IC dice is selected as the maximum core timing grade for the semiconductor module. It should be appreciated that other characteristics of each functional IC die may also be ascertained.

The programmable memory device is then programmed (step 406) to identify the selected functional IC dice having the desired characteristics. The programmable memory device may also be programmed to indicate the maximum operating frequency of the semiconductor module, the maximum core timing grade of the semiconductor module, as well as other characteristics of the semiconductor module or its functional IC dice that may be of use to a controller used in conjunction with the semiconductor module. The information stored in the programmable memory device enables the controller to separately address the functional IC dice in the semiconductor module.

An example of the above process will now be described. Multiple 32 MB IC dice are manufactured from a single silicon wafer. The IC dice are tested and those IC dice capable of operating at 800 MHz are set aside. Four of the 800 MHz IC dice are then assembled into a stacked semiconductor module. The module is then tested to see which IC dice are working. This test happens to reveals that all but the first IC die are working. The remainder of the IC dice are then tested for other characteristics that meet a predetermined standard, such as operating frequencies, core timings ($t_{CAC}$, $t_{RAS}$, $t_{RC}$), etc. It is found that the second and third IC die will operate at 800 MHz, while the fourth IC die will only operate at 700 MHz. The programmable memory device is then programmed to allow access to only the second, third, and fourth dice. The programmable memory device is also programmed to set the maximum operating frequency for the stacked semiconductor module to 700 MHz. In use, the controller after reading the programmable memory device then only accesses the second, third, and fourth IC dice at a frequency no greater than 700 MHz. The stacked semiconductor module can then be sold as a 96 MByte 700 MHz memory module. (The module has a capacity of 96 MB, as one of the IC dice of 32 MB is not functioning.) Prior to this invention, this stacked semiconductor module would have been scrapped.

In the case of a defective die in the system, the controller can reprogram the SPD accordingly.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A method of operation of a module that includes a plurality of integrated circuit dies and a programmable memory device disposed within a housing, wherein the method comprises:

determining a set of integrated circuit dies, of the plurality of integrated circuit dies, that meets a predetermined standard, wherein at least one integrated circuit die of the plurality of integrated circuit dies not included in the set of integrated circuit dies does not meet the predetermined standard; and programming the programmable memory device to identify the set of integrated circuit dies that meets the predetermined standard.

2. The method according to claim 1, wherein said predetermined standard includes a predetermined operating frequency.

3. The method according to claim 1, wherein said predetermined standard includes a predetermined core timing grade.

4. The method according to claim 1, wherein said predetermined standard includes whether an integrated circuit die is functioning.

5. The method according to claim 1, further comprising, prior to said determining, stacking said plurality of integrated circuit dies adjacent to one another.

6. The method according to claim 1, wherein said programming comprises programming fuses.

7. The method according to claim 1, wherein said programming comprises programming a read only memory (ROM) integrated circuit chip.

8. The method according to claim 1, wherein said programming comprises programming a read/write integrated circuit chip.

9. The method according to claim 1, wherein said programming comprises programming an erasable programmable read-only memory (EPROM).

10. A method of operation of a module that includes a plurality of integrated circuit dies and a programmable memory device disposed within a housing, wherein the method comprises:

establishing a first integrated circuit die, of the plurality of integrated circuit dies, that meets a predetermined standard, wherein a second integrated circuit die of the plurality of integrated circuit dies does not meet the predetermined standard; and programming the programmable memory device to identify the first integrated circuit die.

11. The method according to claim 10, wherein said predetermined standard includes a predetermined operating frequency.

12. The method according to claim 10, wherein said predetermined standard includes a predetermined core timing grade.

13. The method according to claim 10, wherein said predetermined standard includes whether an integrated circuit die is functioning.

14. The method according to claim 10, further comprising, prior to said determining, stacking said plurality of integrated circuit dies adjacent to one another.

15. A method of operation of a module that includes a plurality of integrated circuit dies and a programmable memory device disposed within a housing, wherein the method comprises:

determining which of the plurality of integrated circuit dies are functioning circuit dies and which are non-functioning circuit dies; and programming the programmable memory device to identify the functioning circuit dies.

16. The method according to claim 15, further comprising:

determining an operating frequency for each of said functioning circuit dies;

identifying which operating frequency is a lowest operating frequency; and storing in the programmable memory device, the lowest operating frequency as a maximum operating frequency for the module.

17. The method according to claim 15, further comprising:

determining a core timing grade for each of said functioning circuit dies;

identifying which core timing grade is a lowest core timing grade; and storing in the programmable memory device, the lowest core timing grade as a maximum core timing grade for the module.

18. The method according to claim 15, further comprising, prior to said determining, stacking said plurality of integrated circuit dies adjacent to one another.

19. The method according to claim 15, wherein said programming comprises programming fuses.

20. The method according to claim 15, wherein said programming comprises programming a read only memory (ROM) integrated circuit chip.

21. The method according to claim 15, wherein said programming comprises programming a read/write integrated circuit chip.

22. The method according to claim 15, wherein said programming comprises programming an erasable programmable read-only memory (EPROM).

23. A method of operation of a module that includes a plurality of integrated circuit dies and a programmable memory device disposed within a housing, wherein the method comprises:

determining which of the plurality of integrated circuit dies meet a predetermined standard and which of the plurality of integrated circuit dies do not meet the predetermined standard; and programming the programmable memory device to identify the integrated circuit dies that meet the predetermined standard.

24. The method according to claim 23, wherein said predetermined standard includes a predetermined operating frequency.

25. The method according to claim 23, wherein said predetermined standard includes a predetermined core timing grade.

26. The method according to claim 23, wherein said predetermined standard includes whether an integrated circuit die is functioning.

27. The method according to claim 23, further comprising, prior to said determining, stacking said plurality of integrated circuit dies adjacent to one another.

28. The method according to claim 23, wherein said programming comprises programming fuses.

29. The method according to claim 23, wherein said programming comprises programming a read only memory (ROM) integrated circuit chip.

30. The method according to claim 23, wherein said programming comprises programming a read/write integrated circuit chip.

31. The method according to claim 23, wherein said programming comprises programming an erasable programmable read-only memory (EPROM).

32. The method according to claim 23, wherein said determining further comprises:

determining a core timing grade for each of said circuit dies that meet the predetermined standard;

identifying which core timing grade is a lowest core timing grade; and storing in the programmable memory device, the lowest core timing grade as a maximum core timing grade for the module.

33. The method according to claim 23, wherein said determining further comprises:

determining an operating frequency for each of said circuit dies that meet the predetermined standard;

identifying which operating frequency is a lowest operating frequency; and storing in the programmable memory device, the lowest operating frequency as a maximum operating frequency for the module.

* * * * *